US012787396B2

(12) United States Patent
Guo et al.

(10) Patent No.: US 12,787,396 B2
(45) Date of Patent: Nov. 3, 2026

(54) GROUP III-V COMPOUND SEMICONDUCTOR DEVICE AND PASSIVATION STRUCTURE ADAPTED THEREIN

(71) Applicant: XIAMEN SAN'AN INTEGRATED CIRCUIT CO., LTD., Xiamen (CN)

(72) Inventors: Dexiao Guo, Xiamen (CN); Zhidong Lin, Xiamen (CN); Junlei He, Xiamen (CN); Lige Wang, Xiamen (CN); Xiaoyuan Wang, Xiamen (CN); Jie Zhao, Xiamen (CN); Cheng Liu, Xiamen (CN); Nien-tze Yeh, Xiamen (CN)

(73) Assignee: XIAMEN SAN'AN INTEGRATED CIRCUIT CO., LTD., Fujian (CN)

( * ) Notice: Subject to any disclaimer, the term of this patent is extended or adjusted under 35 U.S.C. 154(b) by 707 days.

(21) Appl. No.: 18/319,805

(22) Filed: May 18, 2023

(65) Prior Publication Data

US 2023/0290837 A1 Sep. 14, 2023

Related U.S. Application Data

(63) Continuation-in-part of application No. PCT/CN2021/112122, filed on Aug. 11, 2021.

(30) Foreign Application Priority Data

Nov. 19, 2020 (CN) ........................ 202011302202.3

(51) Int. Cl.
*H01L 29/20* (2006.01)
*H01L 29/66* (2006.01)
*H01L 29/778* (2006.01)
*H10D 30/01* (2025.01)
*H10D 30/47* (2025.01)
*H10D 62/85* (2025.01)

(52) U.S. Cl.
CPC ....... *H10D 62/8503* (2025.01); *H10D 30/015* (2025.01); *H10D 30/475* (2025.01)

(58) Field of Classification Search
CPC ............ H10D 62/8503; H10D 30/015; H10D 30/475; H10D 62/824; H10D 62/103; H10D 30/47; H10D 64/118; H01L 21/02178; H01L 21/02192; H01L 21/02194; H01L 21/022; H01L 21/02205; H01L 21/0228; H01L 23/291; H01L 23/3171; H01L 23/3192; H01L 21/02164; H01L 21/0217; H01L 21/02274
USPC .......................................................... 257/194
See application file for complete search history.

(56) References Cited

U.S. PATENT DOCUMENTS

2015/0028345 A1* 1/2015 Wong .................. H10D 64/693 438/172
2018/0204916 A1* 7/2018 Shimizu ............... H10D 62/824
2020/0075778 A1* 3/2020 Shih ................... H10D 30/6757

* cited by examiner

*Primary Examiner* — Tong-Ho Kim
(74) *Attorney, Agent, or Firm* — MUNCY, GEISSLER, OLDS & LOWE, P.C.

(57) ABSTRACT

A Group III-V compound semiconductor device includes a Group III-V compound substrate and a passivation structure. The passivation structure is disposed on a surface of the Group III-V compound substrate and includes a scandium-nitrogen-containing layer and a scandium-oxygen-containing layer sequentially stacked in that order in a direction away from the surface of the Group III-V compound substrate.

18 Claims, 4 Drawing Sheets

GROUP III-V COMPOUND SEMICONDUCTOR DEVICE AND PASSIVATION STRUCTURE ADAPTED THEREIN

CROSS-REFERENCE TO RELATED APPLICATION

This application is a bypass continuation-in-part (CIP) application of PCT International Application No. PCT/CN2021/112122, filed on Aug. 11, 2021, which claims priority to Chinese Invention patent application No. 202011302202.3, filed on Nov. 19, 2020. The entire content of the International patent application is incorporated herein by reference.

FIELD

The disclosure relates to a semiconductor device and a passivation layer adapted therein, and more particularly to a Group III-V compound semiconductor device and a passivation structure adapted therein.

BACKGROUND

Nowadays, electronics and electric power technology play an important role in modern manufacturing. Electronics and electrically powered devices are indeed ubiquitous: from domestic appliances used in our daily lives to others employed in industrial production, traffic control, and new energy technology. Group III nitride compound semiconductor devices are typically made of a material including gallium nitride (GaN) and cover a wide range of applications. GaN is a wide bandgap third generation semiconductor material that has outstanding characteristics compared to conventional silicon (Si)-based semiconductor materials. Since GaN has a greater bandwidth and higher thermal conductivity, a GaN device has the capacity to operate at higher energy densities and hence has higher reliability. When a semiconductor material has a greater bandwidth and a larger breakdown field, an electronic device with such material used therein has a smaller electrical resistance so that the overall efficiency of the electronic device can therefore be enhanced. The foregoing advantages of GaN indicate that GaN is destined to have a broad application in power switching devices.

However, current collapse effect which is known to occur in GaN devices, severely constrains the practical application of the GaN device. The foregoing current collapse effect refers to a phenomenon in which the output current of a GaN HEMT device decreases during operation. When the GaN device is in the off-state, negative ions are captured in defects located inside of the GaN or on a surface of the GaN in a region at a periphery of a gate electrode proximate to a drain electrode, forming a negatively charged trapping region. The negative ions in the negatively charged trapping region may reduce or even completely exhaust a two-dimensional electron gas (2DEG) channel, which is immediately below the gate electrode, under electrostatic induction, hence forming a channel depletion region. When a voltage is supplied to the gate electrode of the GaN device to turn on the GaN device, the negative ions in the negatively charged trapping region may not be timely released though the 2 DEG channel that is already open. Consequently, the GaN device cannot be fully turned on, resulting in some effects, such as a drop in current density and a reduction of the output power.

Currently, methods for decreasing the current collapse effect include a surface passivation technique and a field plate technique. The surface passivation technique refers to growing a silicon nitride film using plasma enhanced chemical vapor deposition (PECVD) so as to stabilize the interfacial state of a GaN surface, thereby preventing the defects at the GaN surface from capturing negative ions and hence elevating the concentration of the 2 DEG channel. The field plate technique refers to using a metal plate, which is located above and connected to an electrode of the GaN device, and isolated from the GaN device through the silicon nitride film, that metal plate being capable of suppressing the current collapse effect by virtue of electric field regulation, and therefore increasing a breakdown voltage of the GaN device, leading to an increased power output density.

SUMMARY

Therefore, an object of the disclosure is to provide a Group III-V compound semiconductor device and a passivation structure that can alleviate at least one of the drawbacks of the prior art.

According to a first aspect of the present disclosure, the Group III-V compound semiconductor device includes a Group III-V compound substrate and a passivation structure. The passivation structure is disposed on a surface of the Group III-V compound substrate and includes a scandium-nitrogen-containing layer and a scandium-oxygen-containing layer sequentially stacked in that order in a direction away from the surface of the Group III-V compound substrate.

According to a second aspect of the present disclosure, the passivation structure in the Group III-V compound semiconductor device adapted to be disposed on the surface of the Group III-V compound substrate of the Group III-V compound semiconductor device includes the scandium-nitrogen-containing layer and the scandium-oxygen-containing layer sequentially stacked in that order in the direction away from the surface of the Group III-V compound substrate.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
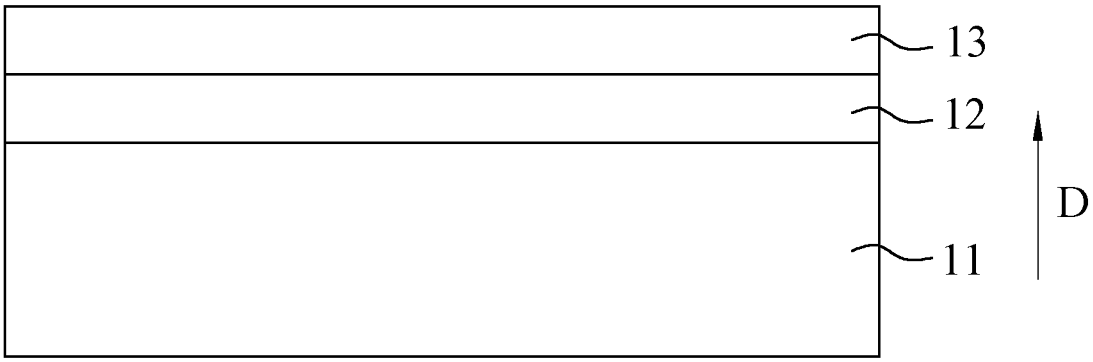
FIG. 1 is a schematic view illustrating an embodiment of a Group III-V compound semiconductor device according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, a Group III-V compound semiconductor device according to an embodiment of the present disclosure includes a Group III-V compound substrate 11 and a passivation structure.

The passivation structure is disposed on a surface of the Group III-V compound substrate 11 and includes a scandium-nitrogen-containing layer 12 and a scandium-oxygen-containing layer 13 sequentially stacked in that order in a direction (which will be referred to as an upward direction (D) hereinafter) away from the surface of the Group III-V compound substrate 11.

In certain embodiments, the material of the Group III-V compound substrate 11 includes Group III-V material, for example, group III-V material is selected from gallium nitride (GaN), aluminum gallium nitride (AlGaN), indium aluminum gallium nitride (InAlGaN), indium gallium nitride (InGaN), indium aluminum nitride (InAlN), indium nitride (InN), and aluminum nitride (AlN).

Figure 4:
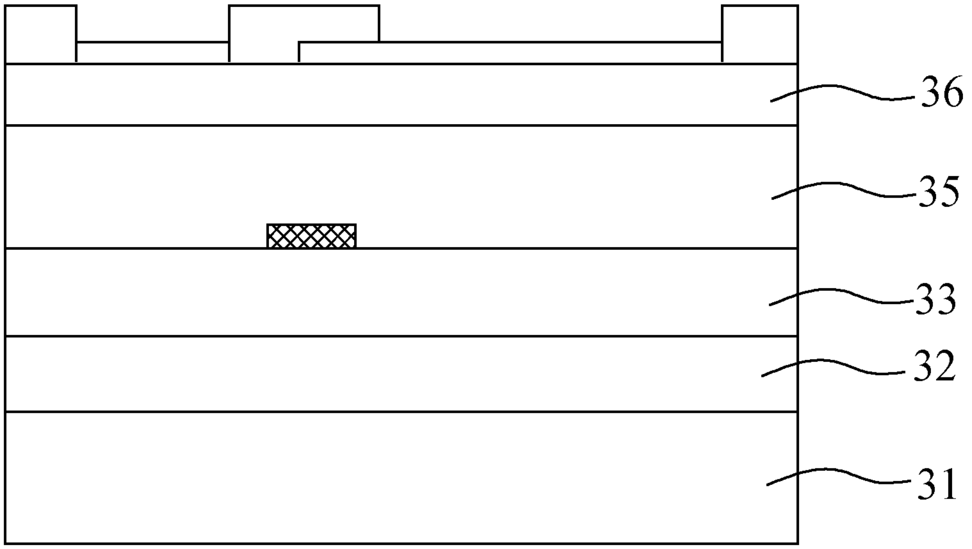
FIG. 4 is a schematic view illustrating still another embodiment of a Group III-V compound semiconductor device according to the present disclosure.

Referring to FIG. 4, in other embodiments, the Group III-V compound substrate 31 may include a silicon (Si) layer, a silicon carbide (SIC) layer, or a sapphire layer and an epitaxial structure stacked in the upward direction (D). In addition, the epitaxial structure includes a nucleation layer 32, a buffer layer 33, a channel layer 35 and a barrier layer 36 stacked in the upward direction (D). The material of the nucleation layer is AlN, the material of the buffer layer is AlGaN or GaN, the material of the channel layer is GaN, and the material of the barrier layer is AlGaN.

In certain embodiments, the scandium-nitrogen-containing layer 12 is an $Al_{1-x}Sc_xN$ layer, where $0<x\leq 1$. In some embodiments, the scandium-nitrogen-containing layer 12 is an $Al_zSc_{3-z}N_3$ layer, where $0<z<3$. In some embodiments, the scandium-nitrogen-containing layer 12 has a thickness in the upward direction (D) ranging from 0.5 nm to 10 nm. In still some embodiments, the scandium-nitrogen-containing layer 12 contains aluminum, and has an aluminum content increasing in the upward direction (D) and a scandium content decreasing in the upward direction (D).

The scandium-oxygen-containing layer 13 is an $Al_ySc_{2-y}O_3$ layer, where $0\leq y<2$. In still some embodiments, the scandium-oxygen-containing layer 13 has a thickness in the upward direction (D) ranging from 1 nm to 20 nm. In yet some embodiments, the scandium-oxygen-containing layer 13 contains aluminum, and has an aluminum content decreasing in the upward direction (D) and a scandium content increasing in the upward direction (D).

Figure 2:
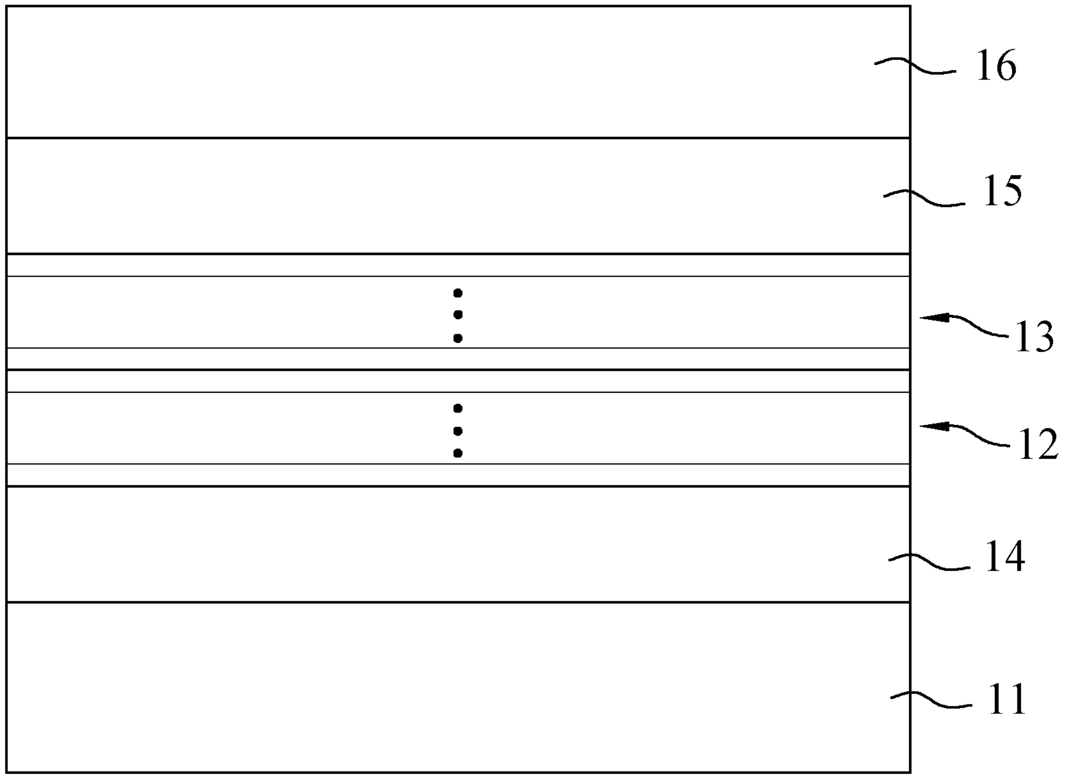
FIG. 2 is a schematic view illustrating another embodiment of a Group III-V compound semiconductor device according to the present disclosure.

Referring to FIG. 2, another embodiment of the disclosure differs from the embodiment of FIG. 1 in that the scandium-nitrogen-containing layer 12 includes a plurality of scandium-nitrogen-containing sublayers stacked in the upward direction (D) and the scandium-oxygen-containing layer 13 includes a plurality of scandium-oxygen-containing sublayers stacked in the upward direction (D). The scandium-nitrogen-containing sublayers contain aluminum. In addition, each of the scandium-nitrogen-containing sublayers closer to the Group III-V compound substrate 11 has an aluminum content less than that of an adjacent one of the scandium-nitrogen-containing sublayers farther to the Group III-V compound substrate 11, and a scandium content greater than that of the adjacent one of the scandium-nitrogen-containing sublayers farther to the Group III-V compound substrate 11.

Referring again to FIG. 2, the scandium-oxygen-containing sublayers contain aluminum. In addition, each of the scandium-oxygen-containing sublayers closer to the Group III-V compound substrate 11 has an aluminum content greater than that of an adjacent one of the scandium-oxygen-containing sublayers farther to the Group III-V compound substrate 11, and a scandium content less than that of the adjacent one of the scandium-oxygen-containing sublayers farther to the Group III-V compound substrate 11.

In certain embodiments, the scandium-nitrogen-containing layer 12 has a thickness in the upward direction (D) less than or equal to a thickness of the scandium-oxygen-containing layer 13 in the upward direction (D).

In an exemplary embodiment, each of the scandium-nitrogen-containing layer 12 and the scandium-oxygen-containing layer 13 is formed via atomic layer deposition.

Referring once again to FIG. 2, in certain embodiments, the passivation structure of the Group III-V compound semiconductor device further includes an AlN layer 14, and the scandium-nitrogen-containing layer 12 is disposed thereon. In some embodiments, the passivation structure of the Group III-V compound semiconductor device further includes an aluminum oxide ($Al_2O_3$) layer 15 which is disposed on the scandium-oxygen-containing layer 13.

In certain embodiments, the Group III-V compound semiconductor device may further include electrodes disposed on the Group III-V compound substrate 11, and the passivation structure covers the electrode and part of the surface of the Group III-V compound substrate 11 between the electrodes.

In certain embodiments, the Group III-V compound semiconductor device further includes a passivation protection layer 16 made of at least one of silicon nitride (SiN), silicon oxide ($SiO_2$) and silicon oxynitride (SiON). The major function of the passivation protection layer 16 is to enhance the insulation effect of the Group III-V compound semiconductor device so as to reduce electrical leakage and suppress the current collapse effect, thereby increasing the output current as well as the output power of the Group III-V compound semiconductor device. Accordingly, the passivation protection layer 16 may also be made of other material(s) without limitation to SiN, $SiO_2$, SiON as long as it is capable of achieving the same function.

The following are examples of the Group III-V compound semiconductor device of the disclosure and comparative examples.

First Example

In the first example, the Group III-V compound semiconductor device of the disclosure has a passivation structure which includes an $Al_{0.2}Sc_{0.8}N$ layer and an $AlScO_3$ layer sequentially stacked from bottom to top. In addition, the $Al_{0.2}Sc_{0.8}N$ layer has a thickness of 1.0 nm, and the $AlScO_3$ layer has a thickness of 1.0 nm.

The steps for fabricating this example include a) controlling a processing chamber of an atomic layer deposition system to be at a temperature of 425° C. until a Group III nitride compound substrate formed in the chamber is temperature-stabilized, followed by successively introducing therein 8 cycles of trimethylaluminum (pulse time: 0.2 seconds), ammonia (pulse time: 0.5 seconds), trimethylaluminum (pulse time: 0.2 seconds), and tris(isopropylcyclopentadienyl) scandium (pulse time: 2 seconds), thereby depositing the $Al_{0.2}Sc_{0.8}N$ layer having the thickness of 1.0 nm on a surface of the Group III nitride compound substrate; and b) lowering the temperature of the processing chamber of the atomic layer deposition system to 300° C. and maintaining the temperature thereat until the Group III nitride compound substrate is temperature-stabilized, followed by successively introducing therein 5 cycles of trimethylaluminum (pulse time: 0.2 seconds), deionized water (pulse time: 0.5 seconds), trimethylaluminum (pulse time: 0.2 seconds), and tris(isopropylcyclopentadienyl) scandium (pulse time: 2 seconds), thereby depositing the $AlScO_3$ layer having the thickness of 1.0 nm on the $Al_{0.2}Sc_{0.8}N$ layer.

Second Example

In the second example, the passivation structure of the Group III-V compound semiconductor device includes an $Al_{0.2}Sc_{0.8}N$ layer and an $AlScO_3$ layer sequentially stacked from bottom to top. In addition, the $Al_{0.2}Sc_{0.8}N$ layer has a thickness of 0.5 nm, and the $AlScO_3$ layer has a thickness of 2.0 nm.

The steps for fabricating this example include a) controlling a processing chamber of an atomic layer deposition system to be at a temperature of 425° C. until a Group III nitride compound substrate is temperature-stabilized, followed by successively introducing therein 8 cycles of trimethylaluminum (pulse time: 0.2 seconds), ammonia (pulse time: 0.5 seconds), trimethylaluminum (pulse time: 0.2 seconds), and tris(isopropylcyclopentadienyl) scandium (pulse time: 2 seconds), thereby depositing the $Al_{0.2}Sc_{0.8}N$ layer having the thickness of 0.5 nm on a surface of the Group III nitride compound substrate; and b) lowering the temperature of the processing chamber of the atomic layer deposition system to 300° C. and maintaining the temperature thereat until the Group III nitride compound substrate is temperature-stabilized, followed by successively introducing therein 10 cycles of trimethylaluminum (pulse time: 0.2 seconds), deionized water (pulse time: 0.5 seconds), trimethylaluminum (pulse time: 0.2 seconds), and tris(isopropylcyclopentadienyl) scandium (pulse time: 2 seconds), thereby depositing the $AlScO_3$ layer having the thickness of 2.0 nm on the $Al_{0.2}Sc_{0.8}N$ layer.

Third Example

In the third example, the passivation structure of the Group III-V compound semiconductor device includes, sequentially from bottom to top, the AlN layer 14, an AlScN layer including an $Al_{0.2}Sc_{0.8}N$ sublayer and an $Al_{0.6}Sc_{0.4}N$ sublayer, an AlScO layer including an $Al_{1.2}Sc_{0.8}O_3$ sublayer and an $AlScO_3$ sublayer, and an $Al_2O_3$ layer 15. In addition, the AlN layer 14 has a thickness of 0.3 nm, the $Al_{0.2}Sc_{0.8}N$ sublayer has a thickness of 0.3 nm, the $Al_{0.6}Sc_{0.4}N$ sublayer has a thickness of 0.4 nm, the $Al_{1.2}Sc_{0.8}O_3$ sublayer has a thickness of 0.5 nm, the $AlScO_3$ sublayer has a thickness of 1.0 nm, and the $Al_2O_3$ layer 15 has a thickness of 0.5 nm.

In this example, $Al_{1-x}Sc_xN$ is constituted by the $Al_{0.2}Sc_{0.8}N$ sublayer and the $Al_{0.6}Sc_{0.4}N$ sublayer, wherein the aluminum content of the AlScN layer increases from bottom (i.e., the $Al_{0.2}Sc_{0.8}N$ sublayer) to top (i.e., the $Al_{0.6}Sc_{0.4}N$ sublayer), and the scandium content of the AlScN layer decreases from bottom (i.e., the $Al_{0.2}Sc_{0.8}N$ sublayer) to top (i.e., the $Al_{0.6}Sc_{0.4}N$ sublayer). The $Al_ySc_{2-y}O_3$ layer is constituted by the $Al_{1.2}Sc_{0.8}O_3$ sublayer and the $AlScO_3$ sublayer, wherein the aluminum content of the AlScO layer decreases from bottom (i.e., the $Al_{1.2}Sc_{0.8}O_3$ sublayer) to top (i.e., the $AlScO_3$ sublayer), and scandium content of the AlScO layer increases from bottom (i.e., the $Al_{1.2}Sc_{0.8}O_3$ sublayer) to top (i.e., the $AlScO_3$ sublayer). The interfacial state caused by lattice mismatches between the Group III-V compound substrate 11 and the passivation protection layer 16 may be greatly reduced through the buffering effect resulting from the alternatively stacking of the scandium aluminum sublayers and the scandium aluminum sublayers. Also, the AlN layer 14 may further reduce the occurrence of the interfacial state.

While the $Al_ySc_{2-y}O_3$ layer in this example has two sublayers, it may include three, four, or even more sublayers as desired. For example, the $Al_ySc_{2-y}O_3$ layer may include an $Al_{1.5}Sc_{0.5}O_3$ sublayer, an $AlScO_3$ sublayer, and an $Al_{0.5}Sc_{1.5}O_3$ sublayer, or may include an $Al_{1.7}Sc_{0.3}O_3$ sublayer, an $Al_{1.1}Sc_{0.9}O_3$ sublayer, an $Al_{0.7}Sc_{1.3}O_3$ sublayer, and an $Al_{0.4}Sc_{1.6}O_3$ sublayer.

Similarly, the $Al_{1-x}Sc_xN$ layer may include three, four, or even more sublayers as required. For instance, the $Al_{1-x}Sc_xN$ layer may include an $Al_{0.3}Sc_{0.7}N$ sublayer, an $Al_{0.5}Sc_{0.5}N$ sublayer, and an $Al_{0.8}Sc_{0.2}N$ sublayer, or may include an $Al_{0.3}Sc_{0.7}N$ sublayer, an $Al_{0.5}Sc_{0.5}N$ sublayer, an $Al_{0.7}Sc_{0.3}N$ sublayer, and an $Al_{0.9}Sc_{0.1}N$ sublayer.

The steps for fabricating this example include a) controlling a processing chamber of an atomic layer deposition system to be at a temperature of 425° C. until a Group III nitride compound substrate is temperature-stabilized followed by successively introducing therein 3 cycles of trimethylaluminum (pulse time: 0.2 seconds) and ammonia (pulse time: 0.5 seconds), thereby depositing the AlN layer 14 having the thickness of 0.3 nm on a surface of the Group III nitride compound substrate; b) changing the flow rate, followed by successively introducing therein 3 cycles of trimethylaluminum (pulse time: 0.3 seconds), ammonia (pulse time: 0.8 seconds), trimethylaluminum (pulse time: 0.3 seconds), and tris(isopropylcyclopentadienyl) scandium (pulse time: 1 second), thereby depositing the $Al_{0.2}Sc_{0.8}N$ sublayer having the thickness of 0.3 nm on the AlN layer 14; c) changing the flow rate, followed by successively introducing therein 3 cycles of trimethylaluminum (pulse time: 0.2 seconds), ammonia (pulse time: 0.5 seconds), trimethylaluminum (pulse time: 0.2 seconds), and tris(isopropylcyclopentadienyl) scandium (pulse time: 2 seconds), thereby depositing the $Al_{0.6}Sc_{0.4}N$ sublayer having the thickness of 0.4 nm on the $Al_{0.2}Sc_{0.8}N$ sublayer; d) lowering the temperature of the processing chamber of the atomic layer deposition system to 300° C. and maintain the temperature thereat until the Group III nitride compound substrate is temperature-stabilized, followed by successively introducing therein 5 cycles of trimethylaluminum (pulse time: 0.4 seconds), deionized water (pulse time: 0.5 seconds), trimethylaluminum (pulse time: 0.2 seconds), and tris(isopropylcyclopentadienyl) scandium (pulse time: 1 second), thereby depositing the $Al_{1.2}Sc_{0.8}O_3$ sublayer having the thickness of 0.5 nm on the $Al_{0.6}Sc_{0.4}N$ sublayer; e) changing the flow rate, followed by successively introducing therein 5 cycles of trimethylaluminum (pulse time: 0.2 seconds), deionized water (pulse time: 0.5 seconds), trimethylaluminum (pulse time: 0.2 seconds), and tris(isopropylcyclopentadienyl) scandium (pulse time: 2 seconds), thereby depositing the $AlScO_3$ sublayer having the thickness of 1.0 nm on the $Al_{1.2}Sc_{0.8}O_3$ sublayer; and f) changing the flow rate, followed by successively introducing therein 5 cycles of trimethylaluminum (pulse time: 0.2 seconds) and deionized water (pulse time: 0.5 seconds), thereby depositing the $Al_2O_3$ layer 15 having the thickness of 0.5 nm on the $AlScO_3$ sublayer.

Fourth Example

In the fourth example, the passivation structure of the Group III-V compound semiconductor device includes a ScN layer and a $Sc_2O_3$ layer sequentially stacked from bottom to top. Moreover, the ScN layer has a thickness of 8 nm, and the $Sc_2O_3$ layer has a thickness of 15 nm.

The steps for fabricating this example include a) controlling a processing chamber of an atomic layer deposition system to be at a temperature of 425° C. until a Group III nitride compound substrate is temperature-stabilized, followed by successively introducing therein 10 cycles of tris(isopropylcyclopentadienyl) scandium (pulse time: 0.2 seconds) and ammonia (pulse time: 0.5 seconds), thereby depositing the ScN layer having the thickness of 8 nm on a surface of the Group III nitride compound substrate; and b) lowering the temperature of the processing chamber of the atomic layer deposition system 300° C. and maintaining the temperature thereat until the Group III nitride compound substrate is temperature-stabilized, followed by successively introducing therein 18 cycles of deionized water (pulse time: 0.5 seconds) and tris(isopropylcyclopentadienyl) scandium (pulse time: 1 second), thereby depositing the $Sc_2O_3$ layer having the thickness of 15 nm on the ScN layer.

Fifth Example

In the fifth example, the passivation structure of the Group III-V compound semiconductor device includes the AlN layer 14, a ScN layer and an $Al_{0.8}Sc_{1.2}O_3$ layer sequentially stacked from bottom to top. In addition, the AlN layer 14 has a thickness of 0.3 nm, the ScN layer has a thickness of 2 nm, and the $Al_{0.8}Sc_{1.2}O_3$ layer has a thickness of 2 nm.

The steps for fabricating this example include a) controlling a processing chamber of an atomic layer deposition system to be at a temperature of 425° C. until a Group III nitride compound substrate is temperature-stabilized, followed by successively introducing therein 3 cycles of trimethylaluminum (pulse time: 0.2 seconds) and ammonia (pulse time: 0.5 seconds), thereby depositing the AlN layer 14 having the thickness of 0.3 nm on a surface of the Group III nitride compound substrate; b), changing the flow rate, followed by successively introducing therein 2 cycles of ammonia (pulse time: 0.5 seconds) and tris(isopropylcyclopentadienyl) scandium (pulse time: 2 seconds), thereby depositing the ScN layer having the thickness of 2 nm on the AlN layer 14; and c) lowering the temperature of the processing chamber of the atomic layer deposition system to 300° C. and maintaining the temperature thereat until the Group III nitride compound substrate is temperature-stabilized, followed by successively introducing therein 20 cycles of trimethylaluminum (pulse time: 0.2 seconds), deionized water (pulse time: 0.5 seconds) and tris(isopropylcyclopentadienyl) scandium (pulse time: 2 seconds), thereby depositing the $Al_{0.8}Sc_{1.2}O_3$ layer having the thickness of 2 nm on the ScN layer.

Sixth Example

In the sixth example, passivation structure of the Group III-V compound semiconductor device includes an $Al_{0.2}Sc_{0.8}N$ layer, a $Sc_2O_3$ layer and the $Al_2O_3$ layer 15 sequentially stacked from bottom to top. In addition, the $Al_{0.2}Sc_{0.8}N$ layer has a thickness of 1.0 nm, the $Sc_2O_3$ layer has a thickness of 2 nm, and the $Al_2O_3$ layer 15 has a thickness of 10 nm.

The steps for fabricating this example include a) controlling a processing chamber of an atomic layer deposition system to be at a temperature of 425° C. until a Group III nitride compound substrate is temperature-stabilized, followed by successively introducing therein 10 cycles of trimethylaluminum (pulse time: 0.2 seconds), ammonia (pulse time: 0.5 seconds), trimethylaluminum (pulse time: 0.2 seconds), and tris(isopropylcyclopentadienyl) scandium (pulse time: 2 seconds), thereby depositing the $Al_{0.2}Sc_{0.8}N$ layer having the thickness of 1.0 nm on a surface of the Group III nitride compound substrate; b) lowering the temperature of the processing chamber of the atomic layer deposition system to 300° C. and maintaining the temperature thereat until the Group III nitride compound substrate is temperature-stabilized, followed by successively introducing therein 3 cycles of deionized water (pulse time: 0.5 seconds) and tris(isopropylcyclopentadienyl) scandium (pulse time: 1 second), thereby depositing the $Sc_2O_3$ layer having the thickness 2 nm on the $Al_{0.2}Sc_{0.8}N$ layer; and c) changing the flow rate, followed by successively introducing therein 100 cycles of trimethylaluminum (pulse time: 0.2 seconds) and deionized water (pulse time: 0.5 seconds), thereby depositing the $Al_2O_3$ layer 15 having the thickness of 10 nm on the $Sc_2O_3$ layer.

Seventh Example

In the seventh example, passivation structure of the Group III-V compound semiconductor device includes an $Al_{1.2}Sc_{1.8}N_3$ layer and an $AlScO_3$ layer sequentially stacked from bottom to top. In addition, the $Al_{1.2}Sc_{1.8}N_3$ layer has a thickness of 1.0 nm, and the $AlScO_3$ layer has a thickness of 2 nm.

The steps for fabricating this example include a) controlling a processing chamber of an atomic layer deposition system to be at a temperature of 425° C. until a Group III nitride compound substrate is temperature-stabilized, followed by successively introducing therein 9 cycles of trimethylaluminum (pulse time: 0.5 seconds), ammonia (pulse time: 0.4 seconds), trimethylaluminum (pulse time: 0.5 seconds), and tris(isopropylcyclopentadienyl) scandium (pulse time: 4 seconds), thereby depositing the $Al_{1.2}Sc_{1.8}N_3$ layer having the thickness of 1.0 nm on a surface of the Group III nitride compound substrate; b) lowering the temperature of the processing chamber of the atomic layer deposition system to 300° C. and maintaining the temperature thereat until the Group III nitride compound substrate is temperature-stabilized, followed by successively introducing therein 10 cycles of trimethylaluminum (pulse time: 0.2 seconds), deionized water (pulse time: 0.5 seconds), trimethylaluminum (pulse time: 0.2 seconds) and tris(isopropylcyclopentadienyl) scandium (pulse time: 2 second), thereby depositing the $AlScO_3$ layer having the thickness of 2.0 nm on the $Al_{1.2}Sc_{1.8}N_3$ layer.

First Comparative Example

A Group III-V compound semiconductor device in the first comparative example has a passivation structure which includes an AlN layer having a thickness of 0.3 nm and an $Al_{0.2}Sc_{0.8}N$ layer having a thickness of 15 nm sequentially stacked from bottom to top. Fabrication steps in this comparative example include a) controlling a processing chamber of an atomic layer deposition system to be at a temperature of 425° C. until a Group III nitride compound substrate is temperature-stabilized, followed by successively introducing therein 3 cycles of trimethylaluminum (pulse time: 0.2 seconds) and ammonia (pulse time: 0.5 seconds), thereby depositing the AlN layer having the thickness of 0.3 nm on a surface of the Group III nitride compound substrate; and b) changing the flow rate, followed by successively introducing therein 120 cycles of trimethylaluminum (pulse time: 0.2 seconds), ammonia (pulse time: 0.5 seconds), trimethylaluminum (pulse time: 0.2 seconds) and tris(isopropylcyclopentadienyl) scandium (pulse time: 2 seconds), thereby depositing the $Al_{0.2}Sc_{0.8}N$ layer having the thickness of 15 nm on the AlN layer.

Second Comparative Example

A Group III-V compound semiconductor device of the second comparative example has a passivation structure which includes an $AlScO_3$ layer having a thickness of 15 nm. Fabrication steps in this comparative example include controlling a processing chamber of an atomic layer deposition system to be at a temperature of 300° C. until a Group III-V compound substrate is temperature-stabilized, followed by successively introducing therein 73 cycles of trimethylaluminum (pulse time: 0.2 seconds), deionized water (pulse time: 0.5 tris(isopropylcyclopentadienyl) scandium (pulse time: 2 seconds), thereby depositing the $AlScO_3$ layer having the thickness of 15 nm on a surface of the Group III nitride compound substrate.

Third Comparative Example

A Group III-V compound semiconductor device in the third comparative example has a passivation structure which includes a $Sc_2O_3$ layer having a thickness of 15 nm. Fabrication steps in this comparative example include controlling a processing chamber of an atomic layer deposition system to be at a temperature of 300° C., followed by successively introducing therein 18 cycles of deionized water (pulse time: 0.5 seconds) and tris(isopropylcyclopentadienyl) scandium (pulse time: 1 second), thereby depositing the $Sc_2O_3$ layer having the thickness of 15 nm on a surface of a Group III nitride compound substrate.

Fourth Comparative Example

A Group III-V compound semiconductor device in the fourth comparative example has a passivation structure which includes a ScN layer having a thickness of 15 nm. Fabricating steps in this comparative example include controlling a processing chamber of an atomic layer deposition system to be at a temperature of 425° C. until a Group III nitride compound substrate is temperature-stabilized, followed by successively introducing therein 20 cycles of tris(isopropylcyclopentadienyl) scandium (pulse time: 0.2 seconds) and ammonia (pulse time: 0.5 seconds), thereby depositing the ScN layer having the thickness of 15 nm on a surface of the Group III nitride compound substrate.

The Group III-V compound semiconductor device of the present disclosure may be implemented in various forms and may include electrodes in addition to the Group III-V compound substrate 11, the passivation structure, and the passivation protection layer 16. The electrodes are disposed on the Group III-V compound substrate 11. The passivation structure covers the electrodes as well as part of the surface of the Group III-V compound substrate 11 between the electrodes. In addition, the passivation protection layer 16 is disposed on the passivation structure.

Experiments were conducted by implementing the Group III-V compound semiconductor devices of the first to sixth examples and the first to fourth comparative examples as GaN-based high electron mobility transistors for investigating current collapse of the transistors. In each of the first to sixth examples, the passivation structure includes both of the scandium-nitrogen-containing layer 12 and the scandium-oxygen-containing layer 13. In each of the first to fourth comparative examples, a different passivation structure is used in place of the passivation structure including both of the scandium-nitrogen-containing layer 12 and the scandium-oxygen-containing layer 13.

Figure 3:
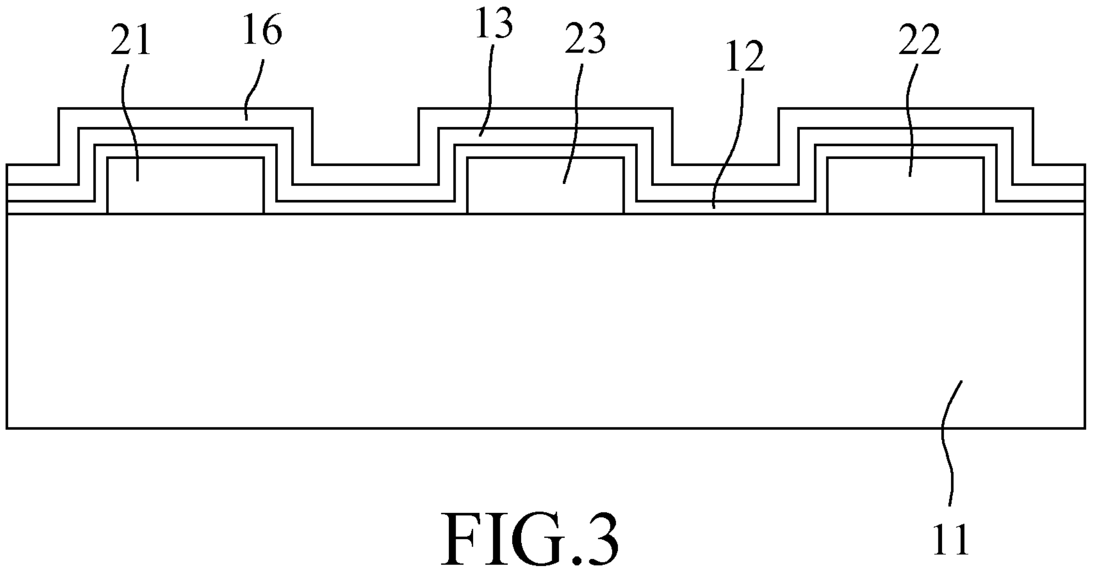
FIG. 3 is a schematic view illustrating is a schematic view illustrating a GaN-based high electron mobility transistor.

Referring to FIG. 3, a GaN-based high electron mobility transistor that adopts each of the first and sixth examples includes the Group III-V compound substrate 11, a source electrode 21, a drain electrode 22 and a gate electrode 23, the passivation structure including the scandium-nitrogen-containing layer 12 and the scandium-oxygen-containing layer 13, and the passivation protection layer 16. The source electrode 21, the drain electrode 22, the gate electrode 23, and the passivation protection layer 16 are disposed on the Group III-V compound substrate 11. Additionally, the scandium-nitrogen-containing layer 12 and the scandium-oxygen-containing layer 13 are disposed sequentially from bottom to top. The scandium-nitrogen-containing layer 12 is disposed on the Group III-V compound substrate 11, the source electrode 21, the drain electrode 22 and the gate 23. The passivation protection layer 16 is disposed on the scandium-oxygen-containing layer 13. To be more specific, the Group III-V compound substrate 11 of the GaN-based high electron mobility transistor is a GaN substrate. In addition, the passivation protection layer 16 is an SiN layer.

The current collapse coefficient data obtained from the experiments are shown in the following table. The data shows that the transistors adopting the first to sixth examples have smaller current collapse coefficient values than that of the transistors adopting the first to fourth comparative examples. As is known in the art, the smaller the current collapse coefficient, the smaller the current collapse effect, and the higher the stability of the transistor. The data also exhibits that the third example in which both the scandium-nitrogen-containing layer 12 and the scandium-oxygen-containing layer 13 have gradually varying sublayers provides the smallest current collapse effect, indicating that the passivation effect on the surface of the GaN substrate is the best. Furthermore, by adopting the passivation structure according to the present disclosure, the stability of the GaN-based high electron mobility transistor is enhanced compared to that of the single layer passivation structure.

TABLE

| | Examples | | | | | | | Comparative Examples | | | |
|---|---|---|---|---|---|---|---|---|---|---|---|
| | 1 | 2 | 3 | 4 | 5 | 6 | 7 | 1 | 2 | 3 | 4 |
| Current collapse coefficient | 15.2 | 13.8 | 5.3 | 13.5 | 12.2 | 13.1 | 11.8 | 18.2 | 22.7 | 25.4 | 17.6 |

According to the present disclosure, the scandium-nitrogen-containing layer 12 and the scandium-oxygen-containing layer 13 are sequentially deposited on the Group III-V compound substrate 11 using atomic layer deposition, followed by growing a silicon nitride layer (serving as the passivation protection layer 16) for surface passivation as conducted conventionally using PECVD. The scandium-nitrogen-containing layer 12 is for nitridation of a natural oxidation layer of the Group III-V compound semiconductor device so as to reduce the interfacial state caused by the natural oxidation layer occurring by exposure to the air. Moreover, by firstly depositing the scandium-nitrogen-containing layer 12, a new interfacial state caused by lattice mismatch at the surface of the Group III-V compound substrate 11 of the Group II-V compound semiconductor device (e.g. a gallium nitride semiconductor device and an aluminum gallium nitride semiconductor device) can be effectively avoided. In addition, the scandium-oxygen-containing layer 13 serves to form a transition layer that can prevent formation of excessive interface state. In addition, since the scandium-oxygen-containing layer 13 is formed by atomic layer deposition, it has the advantages of good step coverage, high uniformity in layer thickness, and high layer density and can effectively avoid plasma-induced surface damage during a subsequent step of forming the passivation protection layer 16 (e.g., the SiN layer) using PECVD. This reduces the generation of interface state and the risk of current collapse effect in the Group III-V compound semiconductor device, and improves the reliability of the Group III-V compound semiconductor device. The technique of making the passivation structure according to the present disclosure is mature and simple, and hence can effectively reduce the generation of the interfacial state as well as suppress the current collapse effect, so as to enhance the performance of the Group III-V compound semiconductor device.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A Group III-V compound semiconductor device, comprising:

a Group III-V compound substrate; and a passivation structure disposed on a surface of said Group III-V compound substrate and including a scandium-nitrogen-containing layer and a scandium-oxygen-containing layer sequentially stacked in that order in a direction away from said surface of said Group III-V compound substrate, wherein said scandium-nitrogen-containing layer contains aluminum, and has an aluminum content increasing in said direction and a scandium content decreasing in said direction.

2. The Group III-V compound semiconductor device as claimed in claim 1, wherein said scandium-nitrogen-containing layer is an $Al_{1-x}Sc_xN$ layer, where $0<x\leq 1$.

3. The Group III-V compound semiconductor device as claimed in claim 1, wherein said scandium-oxygen-containing layer is an $Al_ySc_{2-y}O_3$ layer, where $0\leq y<2$.

4. The Group III-V compound semiconductor device as claimed in claim 1, wherein said scandium-nitrogen-containing layer is an $Al_zSc_{3-z}N_3$ layer, where $0<z<3$.

5. The Group III-V compound semiconductor device as claimed in claim 1, wherein said scandium-nitrogen-containing layer has a thickness in said direction less than or equal to a thickness of said scandium-oxygen-containing layer in said direction.

6. The Group III-V compound semiconductor device as claimed in claim 1, wherein said scandium-oxygen-containing layer contains aluminum, and has an aluminum content decreasing in said direction and a scandium content increasing in said direction.

7. The Group III-V compound semiconductor device as claimed in claim 1, wherein said scandium-nitrogen-containing layer includes a plurality of scandium-nitrogen-containing sublayers stacked in said direction.

8. The Group III-V compound semiconductor device as claimed in claim 7, wherein said scandium-nitrogen-containing sublayers contain aluminum, each of said scandium-nitrogen-containing sublayers closer to said Group III-V compound substrate having an aluminum content less than that of an adjacent one of said scandium-nitrogen-containing sublayers farther to said Group III-V compound substrate, and a scandium content greater than that of said adjacent one of said scandium-nitrogen-containing sublayers farther to said Group III-V compound substrate.

9. The Group III-V compound semiconductor device as claimed in claim 1, wherein said scandium-oxygen-containing layer includes a plurality of scandium-oxygen-containing sublayers stacked in said direction.

10. The Group III-V compound semiconductor device as claimed in claim 9, wherein said scandium-oxygen-containing sublayers contain aluminum, each of said scandium-oxygen-containing sublayers closer to said Group III-V compound substrate having an aluminum content greater than that of an adjacent one of said scandium-oxygen-containing sublayers farther to said Group III-V compound substrate, and a scandium content less than that of said adjacent one of said scandium-oxygen-containing sublayers farther to said Group III-V compound substrate.

11. A Group III-V compound semiconductor device, comprising:

a Group III-V compound substrate, a passivation structure disposed on a surface of said Group III-V compound substrate and including a scandium-nitrogen-containing layer and a scandium-oxygen-containing layer sequentially stacked in that order in a direction away from said surface of said Group III-V compound substrate; and electrodes disposed on said Group III-V compound substrate, said passivation structure covering said electrodes and part of said surface of said Group III-V compound substrate disposed between said electrodes, wherein said scandium-nitrogen-containing layer includes a plurality of scandium-nitrogen-containing sublayers stacked in said direction.

12. The Group III-V compound semiconductor device as claimed in claim 11, wherein said scandium-nitrogen-containing layer is an $Al_{1-x}Sc_xN$ layer, where $0<x\leq 1$.

13. The Group III-V compound semiconductor device as claimed in claim 11, wherein said scandium-oxygen-containing layer is an $Al_ySc_{2-y}O_3$ layer, where $0\leq y<2$.

14. The Group III-V compound semiconductor device as claimed in claim 11, wherein said scandium-nitrogen-containing layer has a thickness in said direction less than or equal to a thickness of said scandium-oxygen-containing layer in said direction.

15. The Group III-V compound semiconductor device as claimed in claim 11, wherein said scandium-nitrogen-containing sublayers contain aluminum, each of said scandium-nitrogen-containing sublayers closer to said Group III-V compound substrate having an aluminum content less than that of an adjacent one of said scandium-nitrogen-containing sublayers farther to said Group III-V compound substrate, and a scandium content greater than that of said adjacent one of said scandium-nitrogen-containing sublayers farther to said Group III-V compound substrate.

16. The Group III-V compound semiconductor device as claimed in claim 11, wherein said scandium-oxygen-containing layer includes a plurality of scandium-oxygen-containing sublayers stacked in said direction.

17. The Group III-V compound semiconductor device as claimed in claim 16, wherein said scandium-oxygen-containing sublayers contain aluminum, each of said scandium-oxygen-containing sublayers closer to said Group III-V compound substrate having an aluminum content greater than that of an adjacent one of said scandium-oxygen-containing sublayers farther to said Group III-V compound substrate, and a scandium content less than that of said adjacent one of said scandium-oxygen-containing sublayers farther to said Group III-V compound substrate.

18. A passivation structure in a Group III-V compound semiconductor device adapted to be disposed on a surface of a Group III-V compound substrate of said Group III-V compound semiconductor device, comprising a scandium-nitrogen-containing layer and a scandium-oxygen-containing layer sequentially stacked in that order in a direction away from said surface of said Group III-V compound substrate, wherein said scandium-nitrogen-containing layer is an $Al_zSc_{3-z}N_3$ layer, where $0<z<3$.

* * * * *